United States Patent
Li (10) Patent No.: US 8,081,025 B1
(45) Date of Patent: *Dec. 20, 2011

(54) BIAS SETTING DEVICE

(75) Inventor: Kan Li, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/787,072

(22) Filed: May 25, 2010

Related U.S. Application Data (63) Continuation of application No. 11/931,422, filed on Oct. 31, 2007, now Pat. No. 7,741,900.

(60) Provisional application No. 60/864,030, filed on Nov. 2, 2006.

(51) Int. Cl.
*G05F 1/46* (2006.01)

(52) U.S. Cl. ......................................... 327/540; 327/545

(58) Field of Classification Search .................. None
See application file for complete search history.

(56) References Cited

U.S. PATENT DOCUMENTS

| | | | |
|---|---|---|---|
| 5,426,334 A * | 6/1995 | Skovmand | 327/427 |
| 6,107,847 A * | 8/2000 | Johnson et al. | 327/143 |
| 6,492,850 B2 * | 12/2002 | Kato et al. | 327/143 |
| 6,492,864 B2 | 12/2002 | Mahrla | |
| 6,741,118 B2 | 5/2004 | Uchikoba et al. | |
| 7,042,281 B2 | 5/2006 | Baglin et al. | |
| 7,365,585 B2 * | 4/2008 | Fort et al. | 327/170 |

* cited by examiner

*Primary Examiner* — Lincoln Donovan
*Assistant Examiner* — Terry L Englund (57) ABSTRACT

A biasing device can supply a bias voltage to bias-able element by coupling a bias circuit to the bias-able element, coupling a state adjusting device to the biasing circuit, configuring the state adjusting device to 1) increase an initial biasing voltage by a first amount when an intermediate voltage threshold exceeds a voltage drop across the bias-able element and 2) increment the increased initial bias voltage by a second amount, where the second amount is a fraction of the first amount, until the voltage drop across the bias-able element substantially equals a predetermined bias voltage. The bias circuit of the biasing device can include a variable resistance, which is controlled by the state adjusting device and configured to vary the biasing voltage, in series with the bias-able element. The variable resistance can include a first variable resistance coupled in series to a first terminal of the bias-able element and a second variable resistance coupled in series to a second terminal of the bias-able element.

21 Claims, 6 Drawing Sheets

BIAS SETTING DEVICE

INCORPORATION BY REFERENCE

This is a Continuation of application Ser. No. 11/931,422 filed Oct. 31, 2007, "Bias Current Compensation Device and Method," now issued as U.S. Pat. No. 7,741,900 on Jun. 22, 2010, which claims the benefit of U.S. Provisional Application No. 60/864,030, "Circuit Structure for Fast Voltage Mode MR-Bias Calibration" filed Nov. 2, 2006. The disclosure of the prior applications is hereby incorporated by reference herein in its entirety.

CROSS-REFERENCE TO RELATED APPLICATIONS

Cross-reference is made to the following co-pending and commonly assigned U.S. patent application Ser. No. 11/931, 508, "Bias Current Compensation Device And Method." The entire disclosure of the above-identified co-pending Application is hereby incorporated herein by reference in its entirety

BACKGROUND

Before use, some electronic components can require calibration. With such electronic components, calibration can be necessary because the initial condition or operational state of the component may be unknown. Calibration can include the acts of 1) comparing an unknown to a standard instrument or reference, then 2) making an adjustment or a correction based on the comparison. In the case of electronic components, the comparison can be between a test bias condition and a reference bias condition and the adjustment can be a change of the test bias level to set a final bias level.

The adjustment steps in a calibration procedure can be constant incremental steps that continue until a calibration completion criterion is satisfied. Since the electronic component's response to each constant incremental step is unknown, the calibration procedure may need to step for an extended period until a bias condition that satisfies the calibration completion criterion is found.

SUMMARY OF THE DISCLOSURE

A biasing device can supply a bias voltage to bias-able element by coupling a bias circuit to the bias-able element, coupling a state adjusting device to the biasing circuit, configuring the state adjusting device to 1) increase an initial biasing voltage by a first amount when an intermediate voltage threshold exceeds a voltage drop across the bias-able element and 2) increment the increased initial bias voltage by a second amount, where the second amount is a fraction of the first amount, until the voltage drop across the bias-able element substantially equals a predetermined bias voltage. The bias circuit of the biasing device can include a variable resistance, which is controlled by the state adjuster and configured to vary the biasing voltage, in series with the bias-able element. The variable resistance can include a first variable resistance coupled in series to a first terminal of the bias-able element and a second variable resistance coupled in series to a second terminal of the bias-able element.

The biasing device can also include a response classifier that is configured to compare the voltage drop across the bias-able element with 1) the intermediate voltage threshold and 2) the predetermined bias voltage to determine 1) when the intermediate voltage threshold exceeds the voltage drop across the bias-able element and 2) when the voltage drop across the bias-able element substantially equals the predetermined bias voltage, respectively. The response classifier can also include a first comparator that is configured to compare the intermediate voltage threshold with the voltage drop across the bias-able element and to determine when the intermediate voltage threshold exceeds the voltage drop across the bias-able element. The response classifier can also include a second comparator that is configured to compare the voltage drop across the bias-able element and to determine when the voltage drop across the bias-able element substantially equals the predetermined bias voltage.

When the first comparator determines that the intermediate voltage threshold exceeds the voltage drop across the bias-able element, then the first comparator outputs an indicative signal to the state adjusting device. When the state adjusting device receives the indicative signal, the state adjusting device subsequently begins to increment the increased initial bias voltage by the second amount.

When the second comparator determine that the voltage drop across the bias-able element substantially equals the predetermined bias voltage, the second comparator outputs an inhibit signal to the state adjusting device. When the state adjusting device receives the inhibit signal, the state adjusting device ceases incrementing the increased initial bias voltage by the second amount. The state adjusting device maintains a constant biasing voltage after ceasing to increment the biasing voltage by the second amount.

The state adjusting device can include 1) a decoder that is coupled to the response classifier and 2) a counter that is coupled to the decoder. The decoder receives a set point from which the decoder generates a codeword corresponding to the initial bias voltage. The counter can be configured to receive a codeword corresponding to the initial bias voltage from the decoder and to output a state adjust signal to the bias circuit to set the initial bias voltage. The state adjusting device can be coupled to a variable resistance included in the bias circuit.

The variable resistance in the bias circuit is coupled in series with the bias-able element and can vary the biasing voltage. The variable resistance can include a first variable resistance coupled in series to a first terminal of the bias-able element and a second variable resistance coupled in series to a second terminal of the bias-able element.

The disclosed method for biasing a bias-able device can include generating an initial biasing voltage, increasing the initial bias voltage by a first amount when an intermediate voltage threshold exceeds a voltage drop across the bias-able device, and incrementing the increased initial bias voltage by a second amount, which is a fraction of the first amount, until the voltage drop across the bias-able device substantially equals a predetermined bias voltage. In order to generate an initial bias voltage, the method can adjust a variable resistance in series with the bias-able device so as to vary the biasing voltage.

The disclosed method can also compare the biasing voltage with both the intermediate voltage threshold and the predetermined bias voltage to determine 1) when the intermediate voltage threshold exceeds the voltage drop across the bias-able device and 2) when the voltage drop across the bias-able device substantially equals the predetermined bias voltage.

The disclosed method can use the response classifier to compare the intermediate voltage threshold with the voltage drop across the bias-able device and determine when the voltage drop across the bias-able device substantially equals the predetermined bias voltage. In determining that the intermediate voltage threshold exceeds the voltage drop across the bias-able device, the response classifier can generate an indicative signal to a state adjusting device, causing the increased initial bias voltage to be incremented by the second amount. When the voltage drop across the bias-able device substantially equals the predetermined bias voltage then an inhibit signal inhibits the state adjusting device. The state adjusting device ceases incrementing the increased initial bias voltage by the second amount and maintains the biasing voltage constant when it is inhibited.

The initial bias voltage is increased by a first amount when an intermediate voltage threshold exceeds a voltage drop across the bias-able device. This occurs when a codeword is received from a decoder that corresponds to the initial bias voltage. Thereafter, a state adjust signal is output to adjust the initial bias voltage. This adjustment or bias voltage variation is accomplished by adjusting the resistance of a variable resistance in series with the bias-able device.

A memory device can include a memory medium, a bias-able device that is configured to read data from the memory medium, a bias circuit, a state adjusting device. The state adjusting device can increase an initial bias voltage by a first amount when an intermediate voltage threshold exceeds a voltage drop across the bias-able device. The state adjusting device can also increment the increased initial bias voltage by a second amount, which is a fraction of the first amount, until the voltage drop across the bias-able device equals a predetermined bias voltage.

The memory device can include for a variable resistance that is coupled in series with the bias-able device, controlled by the state adjusting device, and configured to vary the biasing voltage. The variable resistance can include a first variable resistance coupled in series to a first terminal of the bias-able device and a second variable resistance coupled in series to a second terminal of the bias-able device.

The memory device's response classifier can be configured to 1) compare the biasing voltage with the intermediate voltage threshold and the predetermined bias voltage and 2) determine when the intermediate voltage threshold exceeds the voltage drop across the bias-able device and the voltage drop across the bias-able device substantially equals the predetermined bias voltage. The response classifier can include a first comparator that compares the intermediate voltage threshold with the voltage drop across the bias-able device and a second comparator that determines when the voltage drop across the bias-able device substantially equals the predetermined bias voltage. When the first comparator determines that the intermediate voltage threshold exceeds the voltage drop across the bias-able device, the first comparator outputs an indicative signal to the state adjusting device.

BRIEF DESCRIPTION OF THE DRAWINGS

The invention will be described with reference to the accompanying figures, wherein like numerals represent like elements, and wherein.

DETAILED DESCRIPTION OF EMBODIMENTS

Figure 1:
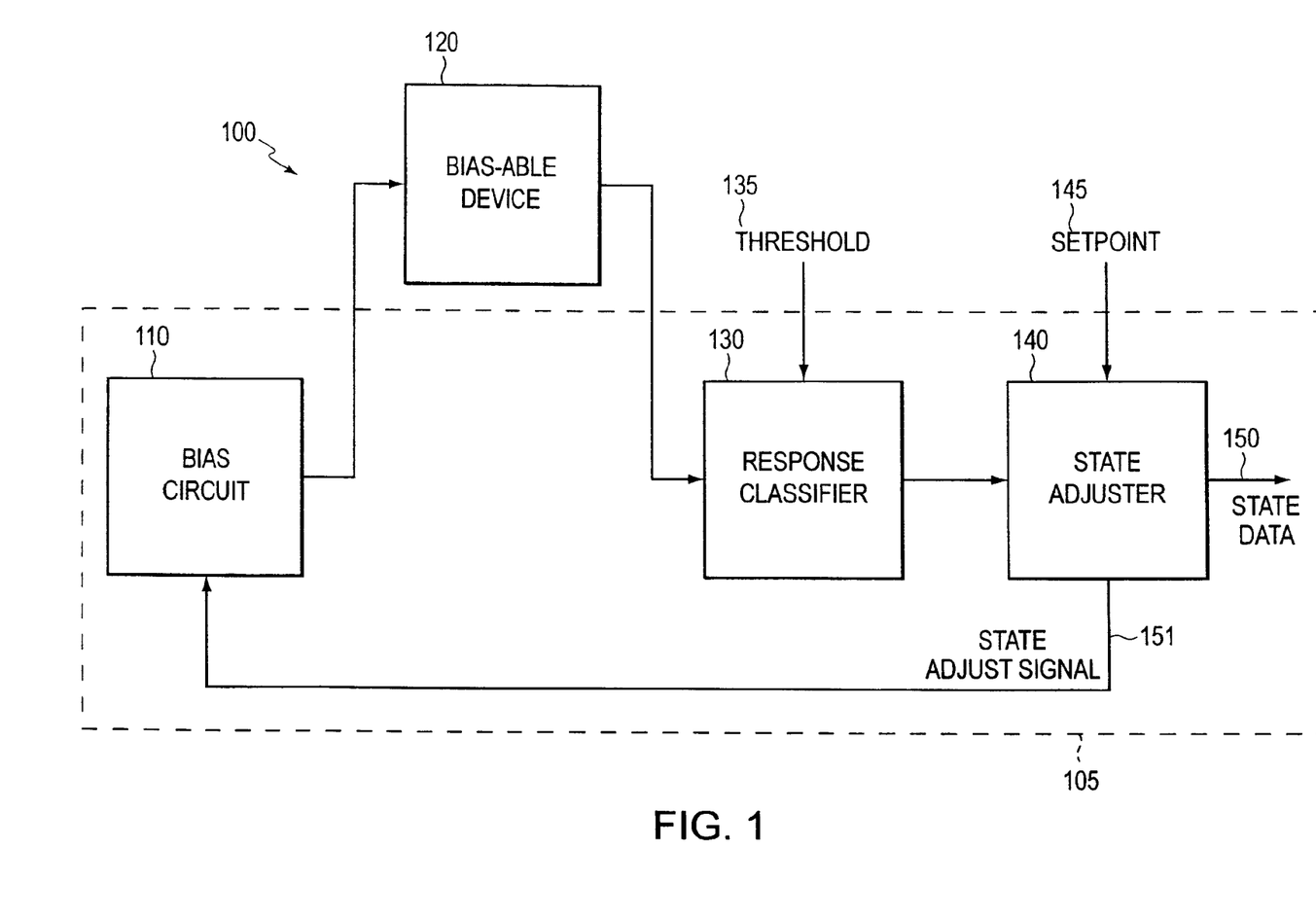
FIG. 1 is an exemplary high-level diagram of the bias setting device.

FIG. 1 shows an exemplary block diagram of the bias setting device 100. The bias setting device 100 can include a bias circuit 110, a bias-able device 120, a response classifier 130, and a state adjuster 140. Each of the elements of the bias setting device 100 can be coupled as shown in FIG. 1.

Bias circuit 110 can adjust the operating conditions or state of bias-able device 120 by receiving a state adjust signal 151 from state adjuster 140 and changing a bias level applied to bias-able device 120. Bias circuit 110 and state adjuster 140 can work together to implement the adjustment steps of bias setting device 100. Bias circuit 110 can provide a probe signal or a dither signal such as a power, a voltage, or a current to bias-able device 120. In an exemplary case, bias circuit 110 can receive a digital word, D, and then adjust either a bias voltage across bias-able device 120 or a bias current through bias-able device 120.

The bias circuit 110 can be any adjustable electrical network of active or passive components. Bias circuit 110 may be energized by one or more power sources that are external to bias setting device 100. In an exemplary case, bias circuit 110 can receive power from two sources, a positive voltage supply and a negative voltage supply and adjust resistances in bias circuit 110 to present a voltage across terminals of bias-able device 120.

Bias-able device 120 can transduce, sense, or receive signals from sources external to bias setting device 100 or transmit signals from bias setting device 100. Bias-able device 120's performance of its transduction, sensing, reception, or transmission functions can be dependent on the bias level.

Bias-able device 120 can be any electronic component that can be biased to a reference condition or placed into a known state before operation. The reference condition can be a DC (constant) or an AC (time-varying) quantity. In an exemplary case, bias-able device 120 can be a magnetoresistor or spin valve set to operate at approximately 200 milliVolts (mV).

Response classifier 130 can receive inputs from bias-able device 120 and threshold 135 and can output a quantized response measurement to state adjuster 140. The quantization levels may or may not be equally spaced or uniform. Response classifier 130 can be any element that categorizes an input according to a threshold criterion, such as a set of levels from threshold 135. In an exemplary case, response classifier 130 can be two comparators or a two-bit flash analog-to-digital converter (ADC) or direct conversion ADC that quantizes a measurement of bias-able device 120 into a first, second, or third classification using two voltage reference levels; i.e. a low range, a mid-range, and a high-range. The quantized response measurement in this exemplary case can be a two-bit binary word of 00, 01, or 11 for the first, second, or third classifications, respectively. In an exemplary case with 3 comparators and 3 voltage reference levels, the response classifier 130 could encode 000, 001, 011, or 111. In the an exemplary case with 4 comparators and 4 voltage levels, the response classifier 130 could encode 0000, 0001, 0011, 0111, or 1111. In the case of N comparators and N voltage reference levels, there can be N+1 classifications from the N zeros pattern to a series of consecutive ones, ending in a pattern of N ones.

State adjuster 140 can accept a setpoint 145 and a state of response classifier 130 and can produce an output state data 150 and a state adjust signal 151 that controls bias circuit 110. State adjuster 140 and bias circuit 110 can control and implement a sequence of adjustments to the state of bias-able device 120, respectively, as part of a calibration procedure. In an exemplary case, output state data 150 can be the same output as state adjust signal 151. In an exemplary case, output state 150 can be a monotonic function of state adjust signal 151. State adjuster 140 can receive input from response classifier 130 and setpoint 145 and can output state data 150 and state adjust signal 151.

State adjuster 140 can produce a sequence of control output states in response to a sequence of input states from response classifier 130. State adjuster 140 can pause in its adjustment of bias circuit 110 at certain times and it can proceed at regular intervals at other times. In an exemplary case, the output states of state adjuster 140 can form an ordered sequence and a starting state in the sequence can be determined by setpoint 145, the starting state can be updated based on input from response classifier 130, and the ordered sequence can be a rising set of counts at regular time intervals.

State adjuster 140 can calculate a next control output based on an input of response classifier 130. State adjuster can calculate a difference in a predetermined threshold from threshold 135 and a quantized response measurement and can multiply the difference by a setpoint 145. In an exemplary case, state adjuster can calculate a next state that can produce a bias level of bias-able device 120 that is less than the predetermined threshold.

During operation, the state adjuster 140 receives setpoint 145 from an external source. The setpoint 145 can include a test code word or an initial bias value of the bias-able device 120 that can be based on knowledge, such as characteristics of the bias-able device 120. The initial bias value can be subsequently transmitted as a state adjust signal 151 to the bias circuit 110. The bias circuit 110 receives these state adjust signal and biases the bias-able device 120 at a bias level corresponding to the initial bias value.

In response to the bias voltage, the bias-able device 120 can be examined to determine a characteristic of bias-able device 120. The measured characteristic, such as a voltage drop across the bias-able device 120, can be received by the response classifier 130. The response classifier 130 can compare the measured voltage drop across the bias-able device 120 with a threshold value contained in the threshold signal 135. If the signal from the bias-able device 120 is close to the threshold value, then the response classifier 130 instructs the state adjuster 140 to increase the initial bias setting by a first amount. However, if the signal received in the bias-able device 120 is not close to the threshold value, then the response classifier 130 instructs the state adjuster 140 to increase the bias value by a second amount.

The state adjuster 140 can increase the bias value by a first amount when the initial bias value results in a voltage drop across the bias-able device 120 that is not close to the threshold value. Thus, the first amount can be a relatively large increase in the bias voltage. Alternatively, the state adjuster 140 can increase the bias voltage to the bias-able device 120 at a relatively smaller second amount when the voltage drop across the bias-able device 120 is closer to the threshold value. Thereafter, the second amount can be incremented in relatively small steps. Thus, the desired threshold voltage drop across the bias-able device 120 can be more precisely approached at a finer level to avoid possible overshoot of the threshold voltage.

Given the foregoing discussion, the operation of bias setting device 100 can be understood as a structured, constrained search. The structured, constrained search can be a special form of analog to digital conversion (ADC) in which a direct conversion or flash ADC precedes a ramp-compare or integrating ADC that does not allow a bias level of a bias-able device to significantly exceed a threshold.

The search's structure and constraints can derive from relationship of the threshold 135 and setpoint 145. In other words, setpoint 145 can establish a conservative, i.e., non-damaging, starting point for a search of bias levels and threshold 135 can cause response classifier 130 to quantize the response of bias-able device 120 with thresholds that are consistent with the starting search point. In an exemplary case, a starting setpoint of setpoint 145 is a linear function of a predetermined bias level threshold or completion-criterion from threshold 135.

The search can start with a trial bias level and the response of bias-able device 120 can be quantized, i.e., compared with one or more threshold values, to select a next digital word that adjusts bias-able device 120 to a next trial bias level. The search can then continue with a fine-grained set of adjustments to satisfy a calibration completion criterion given by a setpoint 145.

The search constraints can be contained in threshold 135 and setpoint 145. The constraints can prevent excessive or damaging bias levels on a given set of bias-able device 120's at any instant during the calibration procedure. In other words, the setpoint 145 can establish an initial bias level that does not exceed the completion criterion threshold from threshold 135 for any bias-able device 120 between a lower limit and an upper limit. In an exemplary case, the lower limit and upper limit can be a voltage across a 100Ω resistance and a voltage across a 600Ω resistance, respectively, for a given digital word from state adjuster 140.

The initial bias level can be increased by a first amount to form an increased bias level if response classifier 130 indicates that the bias level of bias-able device 120 is less than a first intermediate threshold from threshold 135. If not, then either 1) the increased bias level can be incremented by a second amount until the increased bias level equals or exceeds, i.e., crosses, the predetermined bias level threshold, or 2) the foregoing process, starting with establishing an initial bias, can be repeated by a) replacing the initial bias level with a next initial bias level that is greater than the increased bias level but less than the predetermined bias level threshold and b) replacing the intermediate threshold with a subsequent or next intermediate threshold from threshold 135 that is larger than the first intermediate threshold but less than the predetermined bias level threshold.

From a systems or high level perspective, the bias setting device 100 can accept input from threshold 135 and setpoint 145 and can output state data 150 and state adjust signal 151. The inputs and outputs of the bias setting device 100 can be scalars or vectors of code words, voltages, currents, or other digital or analog signals. In an exemplary case, threshold 135 can contain two thresholds, setpoint 145 can contain one set-point, state data 150 can hold the calibrated state of bias-able device 120, and state adjust signal 151 can be a code word.

In an exemplary case, the bias level bias-able device 120 can be a voltage, current, temperature, optical power, polarization, radio frequency (RF) power, magnetic flux density, magnetic field, electric field, chemical potential, entropy, information state, pressure, and the like.

In an exemplary case, bias-able device 120 can be either a receptive component such as a magnetoresistor, a spin valve, a thermistor, a microphone, a photodetector, and the like or an emitter such as a light emitting diode (LED), a laser diode, a superluminescent diode (SLD), an acoustic source, a heat source, an electromagnetic field source, a radio frequency source and the like.

While the state adjuster 140 is shown as an independent unit coupled to the bias circuit 110 and response classifier 130, it can also be incorporated into the response classifier 130, bias circuit 110 and/or may be distributed throughout a controller 105 of bias setting device 100. For example, the state adjuster 140 may be made part of the controller 105 employed by the bias setting device 100 and may be distributed throughout the bias setting device 100. Any configuration that permits monitoring and control of the bias setting device 100 can be used without departing from the spirit and scope of the present disclosure.

The response classifier 130 may also be an independent unit coupled to the bias-able device 120 and the state adjuster 140, or it may be distributed throughout a controller 105 without departing from the spirit and scope of the present disclosure.

Figure 2:
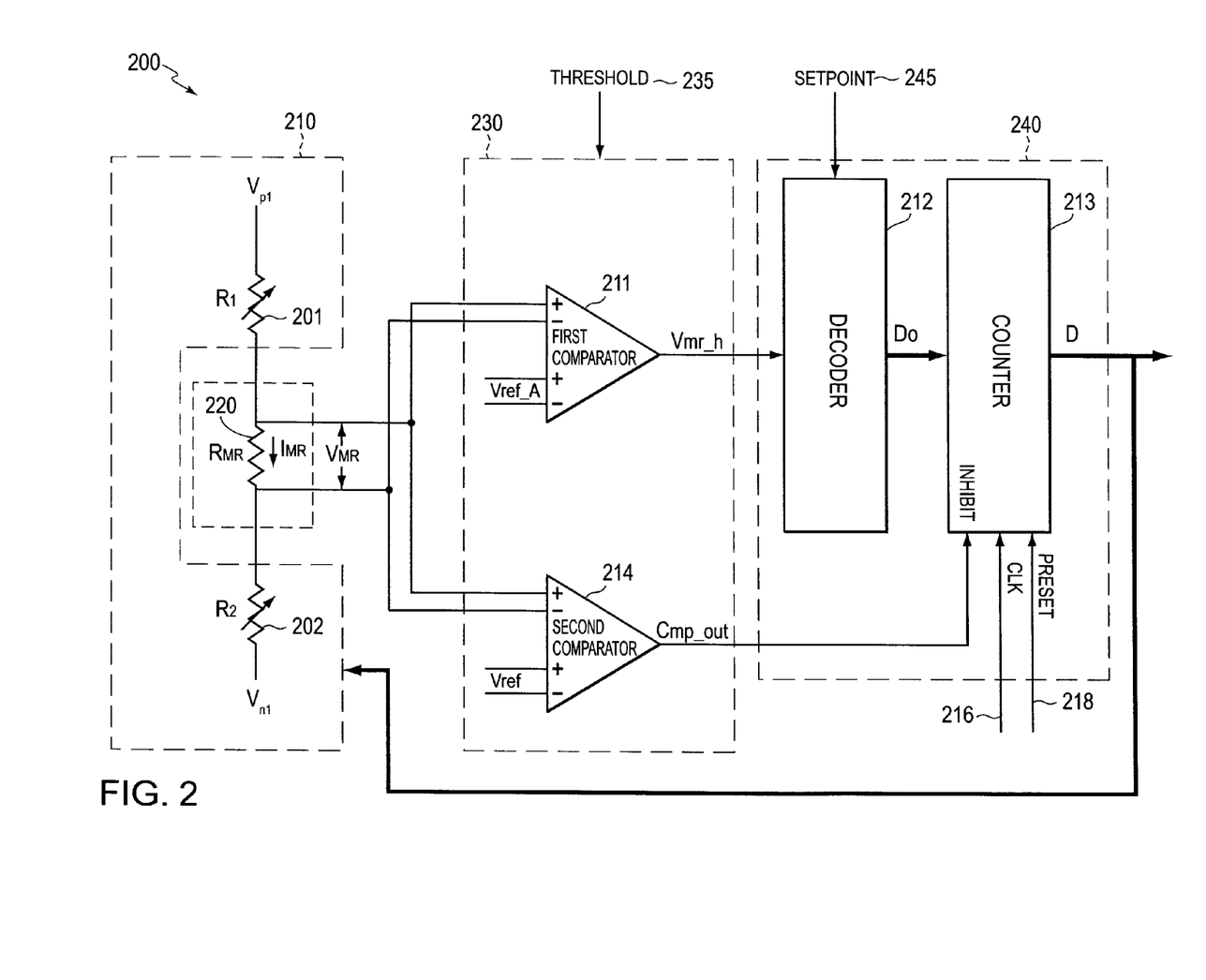
FIG. 2 is an exemplary case of the bias setting device.

FIG. 2 shows an exemplary diagram of bias setting device 200 that can include bias-able device 220, bias circuit 210, response classifier 230, and state adjuster 240. Bias setting device 200 can accept input from threshold 235 and setpoint 245 and can output a control word D. In an exemplary case, D can be a digital output word.

Bias circuit 210 can contain any voltage references, passive components, and active components. Input D from state adjuster 240 can be input to one or more locations of bias circuit 210. Bias circuit 210 can have output terminals for connection to bias-able device 220.

Bias circuit 210 can contain a variable resistance 201 and a variable resistance 202. Variable resistance 201 can be connected to a positive voltage $V_{p1}$. Variable resistance 202 can be connected to a negative voltage $V_{n1}$. Variable resistance 201 and variable resistance 202 can be implemented using digital to analog (DAC) circuits. The resistance of variable resistance 201 and variable resistance 202 can be the net or effective resistance of an electrical network. Voltage $V_{p1}$, $V_{n1}$, $R_1$, and $R_2$ can be replaced by their Thevinin equivalents. (In other words, any electrical network that can produce the same current as the network of $V_{p1}$, $V_{n1}$, $R_1$, and $R_2$ when loaded by a short circuit and the same voltage as the network of $V_{p1}$, $V_{n1}$, $R_1$, and $R_2$ when not loaded.) In an exemplary case, variable resistance 201 and variable resistance 202 can be implemented with resistive ladders within a digital to analog converter (DAC).

During operation of bias circuit 210, the resistance of variable resistance 201 and variable resistance 202 can be varied as a function of a digital control word D. The control word D can contain any number of bits (binary digits) or it can be any symbol from a finite countable set. Control word D can control the resistance of variable resistance 201 and variable resistance 202. In an exemplary case, D can increase or decrease the resistance of variable resistance 201 and variable resistance 202. In one embodiment, the value of variable resistance 201 and the value of variable resistance 202 can decrease when D is an unsigned 7 bit binary number and D increases from a low value of 0000000 to a high value of 1111111. In an exemplary case, D can be denoted D[6:0] and D can be taken as an unsigned binary word D[6:0] taken from an output of counter 213.

In operation, when variable resistance 201 or variable resistance 202 or both decrease, then the $I_{MR}$ current, through bias-able device 220 can increase. $I_{MR}$ can equal $V_{MR}$, the voltage across bias-able device 220 (i.e. the difference in node $V_1$ minus node voltage $V_2$), divided by the resistance, $R_{MR}$, of bias-able device 220.

In operation, bias circuit 210 can control the state of bias-able device 220. In an exemplary case, bias circuit 210 can set the voltage across bias-able device 220 to approximately 200 mV. The output of state adjuster 240 can control the state of bias circuit 210 by, for example, using a control word D.

Bias-able device 220 can be any type of electrical component. In an exemplary case, bias-able device 220 can be a magnetoresistor or a spin valve. In an exemplary case, bias-able device 220 can be a photo-detector. In an exemplary case, bias-able device 220 can be a light emitting diode (LED).

Bias-able device 220 can be set to an operating condition determined by bias circuit 210. Response classifier 230 can characterize the state bias-able device 220. In an exemplary case, bias-able device can be set to approximately 200 mV and not exceed 240 mV during calibration.

Response classifier 230 can be a uniform or non-uniform quantizer with a first comparator 211 and a second comparator 214. In an exemplary case, response classifier 230 can be a nearly uniform two-bit quantizer that uses the states 00, 01, and 11 but not the state 10. In this exemplary case, the rightmost bit is the least significant. Response classifier 230 can receive input, $V_{MR}$, from threshold 235, bias-able device 220, and can send output to state adjuster 240. $V_{MR}$ can be presented to response classifier 230 at one or more locations. In an exemplary case, $V_{MR}$ can be presented to response classifier 230 in two locations. In an exemplary case, the polarity of $V_{MR}$ can be the same at all locations it is presented.

In operation, each comparator of response classifier 230 can receive an input signal and compare the input signal with a threshold value. The threshold values for each comparator can be distinct. In an exemplary case, response classifier 230 can contain two comparators. In an exemplary case, response classifier 230 can contain three or more comparators and the outputs of all comparators can be concatenated to form a larger response classification output word or symbol. In an exemplary case, comparator 211 and comparator 214 are differential input comparators. In other words, these comparators can compare two signal differences rather than the difference of two signals that use a common reference such as ground. Differential comparators can improve immunity to noise and interference by subtracting common-mode voltages from each line of a differential signal pair.

First comparator 211 and second comparator 214 can each output a discrete symbol from a finite set of symbols. In an exemplary case, each symbol can be a quantization word. In an exemplary case, each symbol can be the state of a concatenated set of binary variables.

The threshold 235 can set the threshold values used for first comparator 211 and second comparator 214. In an exemplary case, threshold 235 can contain two values, Vref_A, and Vref. Vref_A can be chosen to minimize bias calibration time. In an exemplary case, Vref_A can be a fraction of Vref, such as Vref/2, that prevents the bias level of bias-able device 220 from exceeding Vref at any time during calibration or at the end of calibration. Vref_A can be chosen to both minimize bias calibration time and to prevent the bias level bias-able device 220 from exceeding Vref at any time during calibration or at the end of calibration.

Vref_A can be set dynamically. In an exemplary case, Vref_A can be set to a low first value at the start of calibration and a higher second value at an intermediate time during calibration and the two values can be called Vref_A1 and Vref_A2.

State adjuster 240 can contain a decoder 212 and a counter 213. State adjuster 240 can accept one or more symbols denoting the state of response classifier 230, a setpoint 245, and signals for clock 216 and a preset 218. State adjuster 240 can output control word D.

In operation, state adjuster 240 can modify the state of bias circuit 210, and thereby increase or decrease the bias voltage on bias-able device 220.

Decoder 212 can be a logic element that accepts a setpoint 245 and an input from response classifier 230 and outputs a selectable function, $D_0$, of an input or setpoint 245. The input to output mapping function selection can be determined from a proper or improper subset of the response classifier state 230. Decoder 212 can be a finite state machine. In an exemplary case, decoder 212 can store past information, including the quantized response from response classifier 230, apply state transition criteria from threshold 235, and can generate a starting value for successive approximation of the bias level of the bias-able device 220 by counter 213 and bias circuit 210.

For a given setpoint 245, decoder 212 can emit one value of symbol $D_0$ when the output of first comparator 211 is high, and another value when first comparator 211 is low. In other words, first comparator 211 can select which of two setpoint-to-decoder output maps is expressed by decoder 212, i.e., the setpoint 245 input to decoder 212 can be an additional address bit to decoder 212. In an exemplary case, decoder 212 can double its output when the output of first comparator 211 is low.

Counter 213 can accept input $D_0$ from decoder 212, a subset of response classifier 230 output, a clock 216, and a preset 218 and can output control word D to bias circuit 210.

In operation, counter 213 can be set to an initial count by preset 218 and the initial count can be $D_0$ from decoder 212. Counter 213 can be clocked by clock 216. In an exemplary case, two preset 218 pulses can occur before the clock 216 signal becomes active. $D_0$ can appear directly on control word D when preset 218 is asserted.

Counter 213 can respond to input signal clock 216 by incrementing the counter state to the next higher state. In an exemplary case, if counter 213 reaches its maximum state, it can hold that state despite further signals from clock 216. In an exemplary case, D can start at a value equal to $D_0$ and increment by one state per pulse of clock 216 and represent the count value as unsigned binary on D.

Output control word D from counter 213 can present signals to variable resistance 201 and variable resistance 202 of bias circuit 210. In an exemplary case, the resistance $R_1$, of variable resistance 201 and the resistance $R_2$, of variable resistance 202 can be linearly related to the unsigned binary value of D. In an exemplary case, when D increases, the resistances of variable resistance 201 and variable resistance 202 can decrease.

Threshold 235 can produce a threshold reference Vref_A at first comparator 211. In an exemplary case, the input difference to first comparator 211 can produce a value $V_{MR\_h}$, that can be high or a logical 1. Decoder 212 can apply a mapping function to setpoint 245 and can present the mapping results on $D_0$. A first preset pulse 218 can then cause counter 213 to load $D_0$ and immediately present that value on control word D. In an exemplary case, a first pulse of preset 218 can arrive within 0.10 µs after setpoint 245 becomes available.

Threshold 235 can be changed immediately after the first pulse of preset 218. In an exemplary case, the component of the threshold 235 that sets Vref_A can be raised or updated from a low value Vref_A1 to a higher value Vref_A2. For a given Vref from setpoint 245 (which can scale both $V_{MR}$ and Vref_A), Vref_A2 can be large enough so that $V_{MR}$ could exceed it. In other words, Vref_A1 can be a small first value so $V_{MR\_h}$ is a logical ONE for any likely value of $R_{MR}$ and the decoder 213's output is not doubled. Subsequently Vref_A can be set to a larger Vref_A2 so that new, doubled starting point can be used if needed. The set point 245 can be chosen so the search can be safe; in other words, so excess voltage or current cannot be applied to bias-able device 220.

In an exemplary case, the output of first comparator 211 can indicate that the $V_{MR}$ voltage across bias-able device 220 has become greater than the updated Vref_A (Vref_A2). In this case, decoder 212 can multiply the value of the function it applies to setpoint 245 and can present the multiplied value as $D_0$ to an input of counter 213.

After the first pulse of preset 218 and after Vref_A has been updated, the response classifier 230 and decoder 212 can require time for their outputs to settle. In one embodiment, these outputs can be allowed to settle for approximately 0.100 µs. After the settling time has elapsed, a second pulse of preset 218 can be generated. When this occurs, a new but not necessarily different value of $D_0$ from decoder 212 can be presented on control word output D of counter 213.

Clock 216 can be started after a second pulse of preset 218 updates control word output D. Clock 216 can operate at a constant frequency thereafter or it can operate with variable period pulses. In an exemplary case, clock 216 can be approximately 50 MHz. In another exemplary case, clock 216 can be chirped upwards or downwards in frequency, thereby implementing an accelerating or decelerating search.

In response to clock 216, counter 213 can step through a series of states and can output the states on control word D. In an exemplary case, counter 213 can increase the value of unsigned binary digits.

Control word D can control bias circuit 210 that, in turn, can change the state of bias-able device 220. In an exemplary case, each pulse of clock 216 can increase $V_{MR}$. When the value of $V_{MR}$ reaches a second component of threshold 235, response classifier 230 can report a different state to state adjuster 240. In other words, a sequence of measurements of the state of the bias-able device can cross a threshold, which can then be reported. There can be two or more such thresholds.

In an exemplary case, $V_{MR}$ can cross a threshold Vref that can be used by second comparator 214 of response classifier 230. In an exemplary case, there can be more than two thresholds in threshold 235 and an equal number of pulses of preset 218.

The calibration process can be complete when a predetermined bias level threshold has been crossed. Thereafter, 1) the output control word D can become constant, 2) clock 216 can stop or counter 213 can be inhibited, 3) bias-able device 220 can be biased to a value set by setpoint 245, and 4) calibration can be complete.

In an exemplary case, an overall calibration or bias setting can be performed in two or more stages. In other words, bias setting can be applied with major steps and minor steps. The major steps can be taken by threshold 235 changes and the minor steps can be taken by counter updates. A first, safe or conservative calibration can be performed and one or more subsequent calibrations can be used. In an exemplary case, a first calibration can be performed to a voltage of approximately 170 mV and a second calibration can be performed to a voltage of approximately 200 mV. Such subsequent calibrations can allow conservative bias setting in damage susceptible devices. Such subsequent calibrations can allow smaller changes and transient overshoot in voltage reference levels. Subsequent calibrations can be initiated based on continuous test results from a dither signal. In other words, after an initial calibration, the state adjuster 240 can periodically make small changes in the bias level of bias-able device 220 and response classifier 230 can determine whether the small changes re-cross the predetermined threshold.

Figure 3:
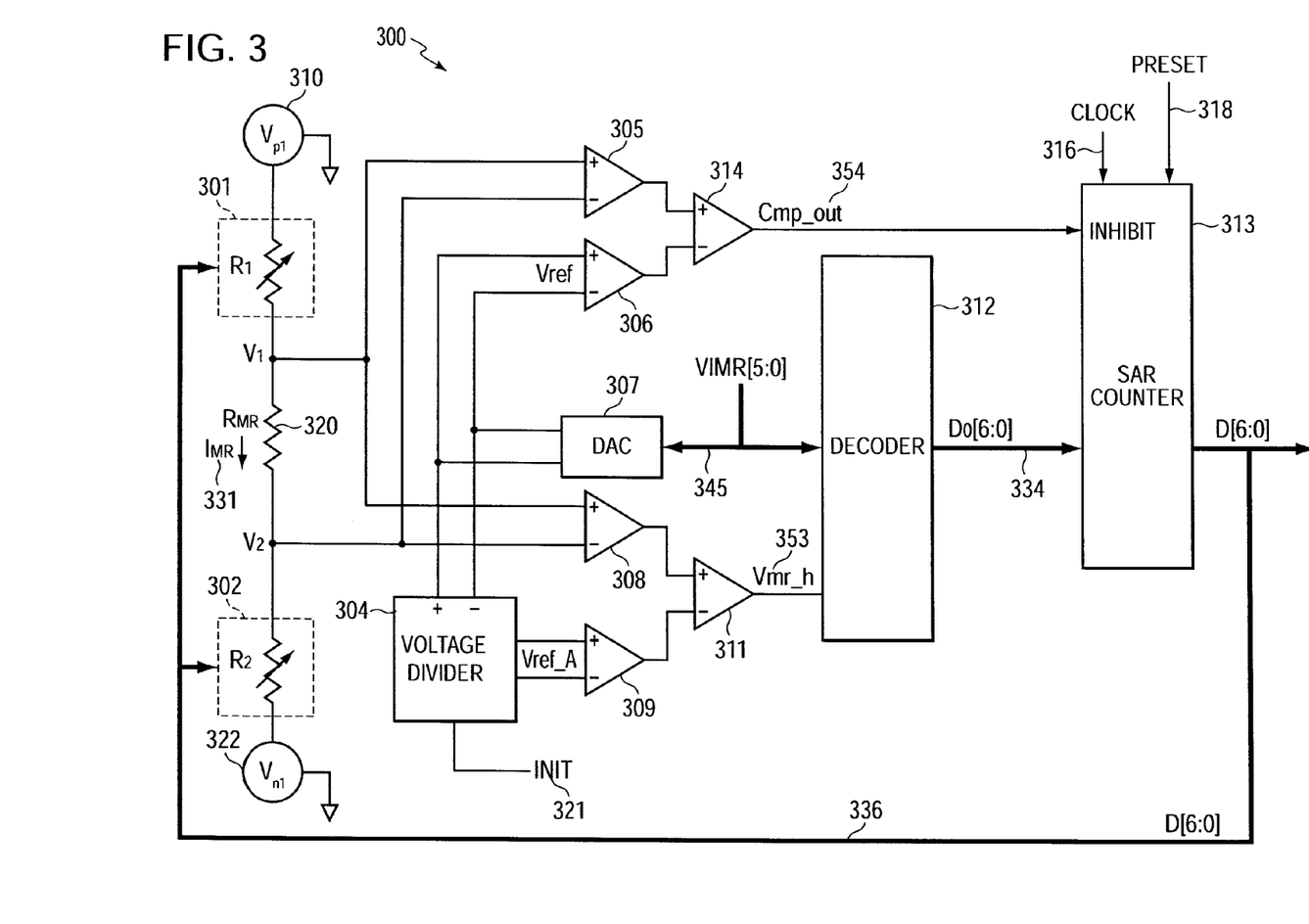
FIG. 3 is an exemplary detailed diagram of the bias setting device.

FIG. 3 shows an exemplary diagram of a bias setting device 300 including a voltage source 310, a variance resistance 301, a variable resistance 302, a bias-able device 320, a voltage divider 304, a differential amplifier 305, a differential amplifier 306, a digital to analog converter DAC 307, a differential amplifier 308, a differential amplifier 309, a first comparator 311, a second comparator 314, a decoder 312, and a (successive approximation register) SAR counter 313. The bias setting device 300 has inputs on bus 345, clock 316, preset 318, and initialization line 321 and output D on bus 336.

Variable resistance 301 can be connected to a positive voltage $V_{p1}$ from voltage source 310. Variable resistance 302 can be connected to a negative voltage $V_{n1}$ from voltage regulator 322. The output of each voltage regulator can be referred to a common ground potential. Variable resistance 301 and variable resistance 302 can be implemented using digital to analog (DAC) circuits. The resistance of variable resistance 301 and variable resistance 302 can be the resistance of an electrical network. The resistance of variable resistance 301 can be the DC voltage across variable resistance 301 divided by the current through variable resistance 301. Likewise, the resistance of variable resistance 302 can be the DC voltage across variable resistance 302 divided by the current through variable resistance 302. Variable resistance 301 and variable resistance 302 can be implemented with resistive ladders.

In operation, the resistance of variable resistance 301 and variable resistance 302 can be controlled as a function of a digital control word. In an exemplary case, D[6:0] can control the resistance of variable resistance 301 and variable resistance 302. In this exemplary case, D[6:0] can increase or decrease the resistance of variable resistance 301 and variable resistance 302. In one embodiment, the value of variable resistance 301 and the value of variable resistance 302 can decrease when D[6:0] increases from a low value of 0000000 bits to 1111111 bits. In this example, D[6:0] can be taken as an unsigned binary code D[6:0] that can be taken from an output of counter 313.

When variable resistance 301 or variable resistance 302 or both decrease, then the current 331, denoted $I_{MR}$, through bias-able device 320, denoted $R_{MR}$, can increase. $I_{MR}$ can equal the difference in node voltage $V_1$ minus node voltage denoted $V_2$ divided by the value of bias-able device 320.

Node voltage $V_1$ and node voltage $V_2$ can be presented to differential amplifier 305 and differential amplifier 308. $V_1$ can be presented to the non-inverting (+) input of differential amplifier 305 and to the non-inverting input of differential amplifier 308. $V_2$ can be presented to the inverting (−) input of differential amplifier 305 and to the inverting input of differential amplifier 308.

In operation, differential amplifier 305 can amplify the difference in voltage presented across its non-inverting input and inverting input. The output of differential amplifier 305 can be a voltage or a current that can be approximately proportional to its input voltage difference. Differential amplifier 308 can amplify the difference in voltage across its non-inverting input and inverting input. The output of differential amplifier 308 can be a voltage or a current that can be approximately proportional to its input voltage difference.

In operation, bus 345 can present control and data signals to DAC 307 and to decoder 312. The data on bus 345 can be denoted VIMR[5:0]. VIMR can be a 6-bit bus of binary digits (bits) 0 through 5. Signals on bus 345 can be synchronous to clock signal 316 or asynchronous.

In operation, the VIMR[5:0] input to DAC 307 can contain a code for setting the output voltage to a value Vref that can be monotonically related to VIMR[5:0]. In one embodiment, the output of DAC 307 can be a voltage Vref that can be approximately proportional to the bits of VIMR[5:0] when such bits form an unsigned binary code word. In an embodiment, the output of DAC 307 can be presented on a pair of signal lines as shown in FIG. 3. In another embodiment, the output of DAC 307 can be one signal line and the voltage reference for the signal from DAC 307 can be the same as the ground potential from which $V_{p1}$ and $V_{n1}$ are referenced. In this embodiment, the signal from DAC 307 can go to the non-inverting input of differential amplifier 306 and the non-inverting input of voltage divider 304. In one embodiment, the inverting input of differential amplifier 306 and voltage divider 304 can be connected to ground.

In operation, voltage divider 304 can take input signals from DAC 307. Voltage divider 304 can have one or two input terminals and one or two output terminals. In one embodiment, voltage divider 304 can accept a differential signal pair as shown in FIG. 3 and produce a differential pair of signals that are input to differential amplifier 309. In another embodiment, voltage divider 304 can take a single signal line from DAC 307 and can use a single signal line connect to differential amplifier 309. In this latter embodiment, the inverting input of differential amplifier 309 can be grounded.

Voltage divider 304 can produce a signal Vref_A that can be monotonically related to Vref. In an exemplary case, Vref_A can be approximately proportional to Vref. In an exemplary case, Vref_A can be approximately ½ of Vref. A value of ½ Vref could for example, provide the benefits of two calibration modes. In other words, the calibration process could implement a binary search.

In operation, the output of differential amplifier 305 and differential amplifier 306 sends signals to the non-inverting input and inverting input of second comparator 314, respectively. Second comparator 314 can implement a highly nonlinear function of the difference between its non-inverting and inverting inputs. The nonlinear function can be a sign function. In other words, second comparator 314 can produce a positive output voltage when the signal at its non-inverting input becomes greater than the signal at its inverting input and a non-positive (negative or zero) output voltage when the signal at its non-inverting input becomes less than the signal at its inverting input.

In operation, the output of second comparator 314 send signals to SAR counter 313. The output signal from second comparator 314, Cmp_out 354, can inhibit SAR counter 313 when Cmp_out 354 is high or a logical ONE. The effect of Cmp_out 354 on SAR counter 313 can be said to freeze its output D[6:0] at the value it held when Cmp_out 354 went high. A low value of Cmp_out 354 can allow SAR counter 313 to be preset by preset 318 and clocked by clock 316.

In operation, the output of differential amplifier 308 and differential amplifier 309 can be sent to the non-inverting input and inverting inputs of first comparator 311, respectively and the output of first comparator 311 can be sent to an input of decoder 312.

First comparator 311 can take input initialization line 321 from differential amplifiers 308 and 309 on its non-inverting and inverting inputs, respectively, and can output a signal $V_{MR\_h}$ 353.

The operational characteristics of first comparator 311 can be the same as second comparator 314 except that when initialization line 321 is asserted, the $V_{MR\_h}$ 353 can be held high or a logical ONE. In an exemplary case, when $V_{MR\_h}$ is held high within 0.100 μs after initialization line 321 is asserted.

Decoder 312 can be a logic element that accepts an input state and outputs the same or a different state. Decoder 312 can contain two or more maps between input states and output states.

In operation, the function decoder 312 uses to map from bus 345 input to $D_0$ output can be selected by an input signal $V_{MR\_h}$ 353. The state of the output of decoder 312 can be given by a set of output lines forming a bus and any such bus can include a load signal, a data available signal, or a data valid signal. In an exemplary case, the bus 345 input can be 6 bits of data, VIRM[5:0] and the $D_0$ output can be 7 bits of data $D_0$[6:0]. In an exemplary case decoder 312 can accept the VIRM[5:0] data, monotonically map that data to a value, double that value when the signal on the $V_{MR\_h}$ line is low, and can present the doubled value on $D_0$[6:0]. In other words, the behavior of decoder 312 when a $V_{MR\_h}$ signal is not asserted can be a mapping from input state to output state so the output state rapidly responds to changes in the input state. The relationship of input to output can be pre-assigned and programmed into decoder 312.

SAR counter 313 can have input lines that take signals from the output of decoder 312, $D_0$[6:0]. SAR counter 313 can accept an input signal clock 316 and a preset signal 318. SAR counter 313 can output signals D[6:0].

SAR counter 313 can be a preset-able counter. In an exemplary case, the value on SAR counter 313 inputs can be $D_0$[5:0] and this input can be accepted as the state of SAR counter 313 when preset 318 is asserted. The preset 318 can be edge triggered or a level. In an exemplary case, preset 318 can be rising edge-triggered. When preset 318 is asserted $D_0$[6:0] can appear directly on output bus D[6:0].

SAR counter 313 can respond to input signal clock 316 by incrementing the counter state to the next higher state. In an exemplary case, if SAR counter 313 reaches its maximum state, it can hold that state despite further signals from clock 316. In an exemplary case, D[6:0] can start at a value equal to $D_0$[6:0] and increment by one state per pulse of clock 316 and represent the count value as unsigned binary on D[6:0].

Output bus D[6:0] of SAR decoder 313 can present signals to variable resistance 301 and variable resistance 302. In an exemplary case, the resistance $R_1$, of variable resistance 301 and the resistance $R_2$, of variable resistance 302 are linearly related to the unsigned binary value of D[6:0]. In an exemplary case, when D[6:0] increases, the resistance of variable resistance 301 and variable resistance 302 can decrease. In this case, of the currents to the input terminals of differential amplifiers 305 and 308 are negligible then the current, $I_{MR}$, through $R_{MR}$ can be approximated as:

$$I_{MR}=(V_{p1}-V_{n1})/(R_1+R_{MR}+R_2) \quad (1)$$

and the voltage across $R_{MR}$ can be approximated as:

$$V_{MR}=(V_{p1}-V_{n1})R_{MR}/(R_1+R_{MR}+R_2). \quad (2)$$

$V_{MR}$ can also obey the relation:

$$V_{MR}=V_1-V_2. \quad (3)$$

The operational behavior of bias setting device 300 can be discussed with reference to different cases, each case corresponding to the value of bias-able device 320. Manufacturing tolerances for bias-able device 320 can span a wide range relative to the average value of a large set of such resistances. For example, the manufacturing tolerance of $R_{MR}$ can be a range from 100 to 600Ω and the average of a distribution of such resistances can be 300Ω.

In an exemplary case, after a first pulse on preset 318 the voltage $V_{MR}$ can be less than Vref_A. This exemplary case can apply when $R_{MR}$ is less than approximately 300Ω. In this case, the input difference to first comparator 311 can be negative and the output of first comparator 311, $V_{MR\_h}$, can be low. Accordingly, decoder 312 can double the value of VIMR[5:0] and can present the doubled output, $D_0$[6:0], to an input of SAR counter 313. A second pulse on preset 318 can then cause SAR counter 313 to load $D_0$[6:0], which can immediately present that value on D[6:0]. In an exemplary case, a preset pulse can arrive within 0.100 microseconds (µs) of the start of calibration.

In an exemplary case, after a first pulse on preset 318, $V_{MR}$ can be greater than or equal to Vref_A. This exemplary case can apply when $R_{MR}$ is greater than approximately 300Ω. In this case, the input difference to first comparator 311 is positive and the output of first comparator 311, $V_{MR\_h}$, is high or a logical ONE. Accordingly, a function of VIMR[5:0] can be presented on the decoder 312 output, $D_0$[6:0], and that value can be input to SAR counter 313. A second pulse on preset 318 can then cause SAR counter 313 to load $D_0$[6:0] and immediately present that value on D[6:0]. In an exemplary case, a second preset pulse can arrive within 0.100 µs after the first preset pulse.

In either exemplary case (initial $V_{MR}$<Vref_A or initial $V_{MR}$>=Vref_A), after the a second pulse arrives on preset 318 pulse, subsequent clock pulses from clock 316 can cause SAR counter 313 to increment its count by, for example, one unit and immediately present the new count on D[6:0]. The new count can cause $R_1$ and $R_2$ to change so the electrical current 331 through $R_{MR}$ and the voltage across $R_{MR}$ ($V_1$-$V_2$) can both increase as given by equations (1) and (2), respectively. SAR counter 313 can then increment in response to additional clock 316 pulses and the voltage $V_{MR}$ can increase accordingly.

The duration of calibration can be a quite short in certain cases. In one exemplary case, when $R_{MR}$ is large so that $V_{MR}$ is initially slightly less than Vref, the calibrator can complete calibration in a few SAR counts. In another exemplary case, when the particular value of $R_{MR}$ is near the mode or most common value of the statistical distribution of resistance values so that $V_{MR}$ is slightly less than Vref_A, then the doubling action of decoder 312 can rapidly place $V_{MR}$ at a voltage slightly less than Vref. In this case, the calibrator can complete calibration in a several SAR counts. In sensitive devices that can be damaged by over-voltage, these cases cover both the maximum-value worst-case condition and highly probable portions of the distribution of electronic component values and rapidly produce accurate calibration results. It should be appreciated that, if exceeded, maximum worst-case condition may cause immediate or delayed component failure.

When $V_{MR}$ approximately equals or exceeds, i.e., crosses, Vref, the signal on the inverting terminal of second comparator 314 can exceed the signal on the non-inverting terminal of second comparator 314 and the output voltage of second comparator 314, Cmp_out 354, can go high. Cmp_out 354 can inhibit further changes in the count of SAR counter 313 and can prevent SAR counter 313 from responding to preset 318 pulses. In an exemplary case, when Cmp_out 354 goes high, the $V_{MR}$ approximately equals Vref and calibration is complete. In an exemplary case, $V_{MR}$ can be prevented from exceeding Vref by more than approximately the average step change in $V_{MR}$ caused by one SAR count.

When calibration has been complete, the state of the fast voltage mode MR bias calibrator can be known, with Cmp_out 354 asserted, the SAR counter 313 inhibited, D[6:0] frozen, the values of variable resistance 301 and variable resistance 302 fixed, and the voltage across bias-able device 320 can be fixed at a predetermined value given by VIMR[5:0]. The fast voltage mode MR bias calibrator can perform these actions accurately and rapidly, without significant overshoot despite a wide uncertainty in the value of bias-able device 320.

Figure 4:
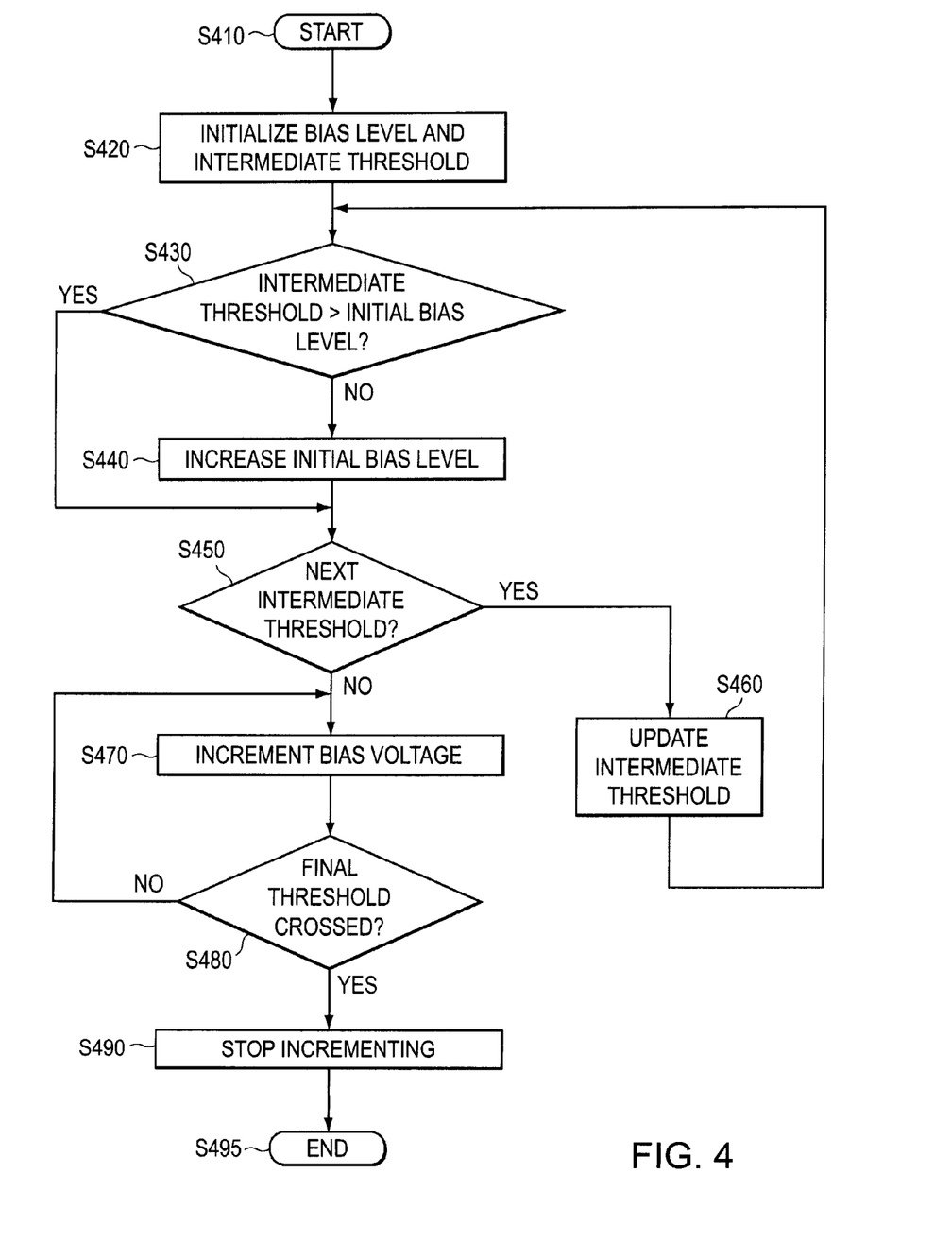
FIG. 4 is an exemplary flowchart of the bias setting device.

FIG. 4 shows an exemplary program flowchart for implementing of the bias setting device 100. The program can start at step S410 and can proceed to step S420 in which a first intermediate threshold value and an initial bias level can be applied. In an exemplary case, the first intermediate threshold can be a value Vref_A from threshold 135 and a digital word D derived from setpoint 145 can cause bias circuit 110 to apply an initial bias level to bias-able device 120.

After step S420, program flow can proceed to step S430 where the initial bias level of a bias-able device can be compared with the intermediate threshold. If the intermediate threshold is greater than the initial bias level, program flow can proceed to step S450, otherwise, program flow can proceed to step S440.

In step S440, the initial bias level can be increased by a first amount to form an increased initial bias level. In an exemplary case, the first amount can be approximately equal to the initial bias level so the increased initial bias level can be approximately double the initial bias level.

After step S440, program flow can proceed to step S450 wherein the availability of a next intermediate threshold can be tested. If a next intermediate threshold is available then program flow can proceed to step S460, otherwise program flow can proceed to step S470.

When and if program flow proceeds from step S450 to step S460, step S460 can update the intermediate threshold from a threshold input. In an exemplary case, the next intermediate threshold is a threshold value greater than the initial intermediate threshold and less than a threshold.

When and if program flow proceeds from step S450 to step S470, step S470 can increment the bias level by a second amount. In an exemplary case, the second amount is a fraction (i.e. less than 100%) of the first amount.

After step S470, program flow can proceed to step S480 where the bias level can be compared with a predetermined bias level threshold. If the bias level is less than the predetermined bias level threshold then the predetermined bias level threshold has not been crossed and program flow can proceed to step S470, otherwise program flow can proceed to step S490. In an exemplary case, the predetermined bias level threshold can be the maximum element of threshold 135.

When and if program flow proceeds from step S480 to step S490, the process of incrementing the bias level can stop. In an exemplary case, the incrementation can stop when a Cmp_out signal is asserted by second comparator 214 to inhibit counter 213.

After step S490, program flow can proceed to step S495 where it can stop.

Figure 5:
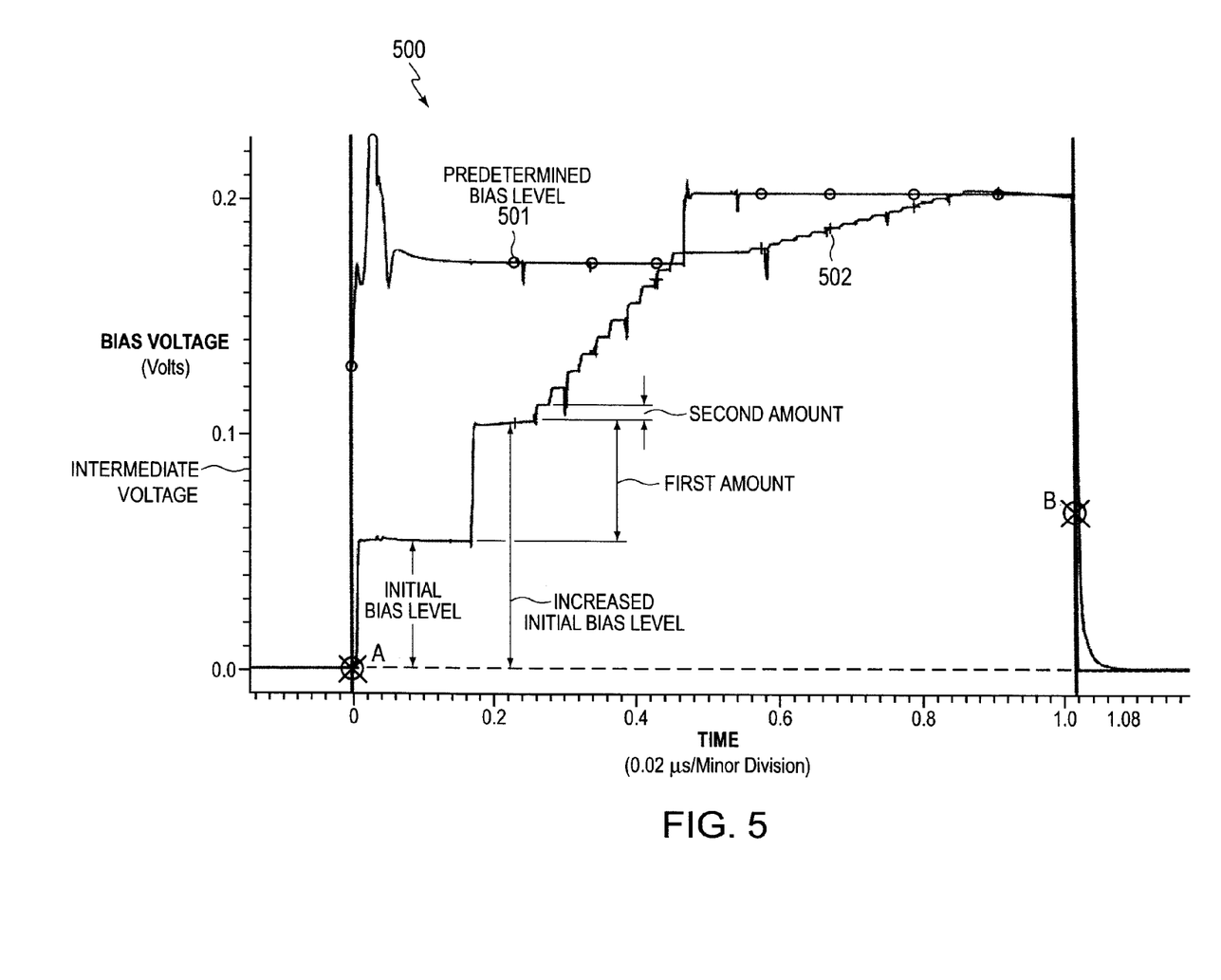
FIG. 5 is an exemplary time domain simulation of the bias setting device.

FIG. 5 shows an exemplary simulation 500 of the bias setting device in operation. FIG. 5 shows two calibration cycles or stages. The first cycle can start at point A and can end at approximately 0.475 μs. A second calibration cycle can start immediately after the first cycle and can end at approximately 1.0 μs at point B.

Calibration cycles can be invoked by an external controller. The controller can remove a fraction of the remaining difference between the bias-able device's voltage and a predetermined bias voltage. The controller can set thresholds and setpoints so the preset pulses can generate steps that are larger than those steps due to clock cycle increments.

Vref trace 501 shows an exemplary plot of a reference voltage and $V_{MR}$ trace 502 shows a plot of the voltage across an exemplary bias-able device. Both traces start at approximately zero volts at point A at time of 0.00 microseconds (μs). Thereafter Vref can rise to approximately 170 mV. As described previously, Vref can be proportional to VIMR[5:0] and can be an output of DAC 307. A transient can accompany the rise in Vref approximately (0.10 μs) before settling to approximately 170 mV.

$V_{MR}$ trace 502 can initially rise when 1) the decoder 312 is initialized by set point VIMR[5:0], 2) SAR counter 313 is preset or loaded by preset 318 pulse, 3) SAR counter 313 generates D[6:0], and 4) the variable resistances 301 and 302 decrease resistance and the current to bias-able device 320 increases. In the exemplary case shown, trace 502 rises to approximately 56 mV and holds nearly that value for approximately 0.17 μs. The first preset pulse can cause both traces 501 and 502 to rise within about 0.020 μs after point A. In an exemplary case, a second, larger value of threshold Vref_A (Vref_A2) can then be applied to first comparator 211. After a settling time, the output of first comparator 211, decoder 212, and both traces 501 and 502 have stabilized. Subsequently, a second preset 318 pulse, approximately 0.10 μs after the first, can cause the output D[6:0] of SAR counter 213 to be updated.

For this exemplary case, $V_{MR}$ can double from its initial value due to the signal path from counter 213 to bias circuit 210 to bias-able device 220 and the doubled output from decoder 212. After $V_{MR}$ in trace 502 doubles, counter 213 can count in steps that can cause $R_1$ and $R_2$ to change, thereby increasing $V_{MR}$ in steps. As shown in FIG. 5, all such steps are not necessarily identical in step size or in transient content. Each step can contain transients that are small in comparison to the predetermined bias level Vref and are brief in comparison to the overall calibration time. (FIG. 5 shows an overall calibration time of approximately 1.0 μs.)

Trace 502 in FIG. 5 shows step increases in $V_{MR}$ over an interval of approximately 0.210 μs from 0.265 μs to 0.475 μs. Each step in FIG. 5 can be approximately 7 mV and the step period can be approximately 0.020 μs per step. This can correspond to a clock frequency of approximately 50 MHz. After $V_{MR}$ reaches the initial value of Vref, the Cmp_out signal from second comparator 214 can be asserted and the counter 213 output state D[6:0] can be frozen.

FIG. 5 shows a second calibration starting approximately 0.475 μs after point A. Such a two-stage calibration can be desirable when a transient overshoot in reference voltage can damage a sensitive component. The second stage, refinement calibration can begin by loading a new value of VIRM[5:0] into decoder 212 and a larger value of Vref from threshold 235. In this exemplary case, $V_{MR}$ can already be larger than Vref_A so the value of $D_0$[6:0] from decoder 212 may not be affected by the $V_{MR\_h}$ line. When preset 318 is de-asserted, clock 316 can increase output D[6:0] of SAR counter 313 in steps.

FIG. 5 shows the step size and step period over an interval of approximately 0.20 μs from 0.56 μs to 0.76 μs is approximately 2 mV/step and 0.020 μs/step, respectively. The clock can be constant during calibration and, in an exemplary case, the clock frequency can be approximately 50 MHz. The step size may or may not be approximately constant and can be a function of the nonlinear code to resistance transfer characteristic of, for example, a digital-to-analog (DAC) implementation of variable resistance 301 and variable resistance 302. In other words, the resistive network characteristics of variable resistances 301 and 302 are not necessarily linear but can produce a monotonic relationship in $V_{MR}$ versus D[6:0] code words, when, for example, such code words are unsigned binary.

As shown in FIG. 5, different Vrefs can be applied at different times. In an exemplary case, a first Vref can be applied and there can be a first major step from nearly zero bias ($V_{MR}$=0 volts) to a first bias level of bias-able device 220. Next, there can be a major adjustment step if $V_{MR}$<½Vref and the preloaded value to counter 213 approximately doubles. Thereafter, there can be minor steps when counter 213 increments. These minor steps can stop when the second comparator 214 output signal, Cmp_out, is asserted.

Next, a new Vref can be applied and there can be a second major step in $V_{MR}$. The second major step can be due to a change in VIMR[5:0], decoding of VIMR[5:0] by decoder 212, preloading of a second decoder output into counter 213, and adjustment of bias circuit 210.

In the exemplary case of FIG. 5, after the second major step, the decoder 212 output is not doubled. In this case, an adjustment step does not follow the second major step but there are minor steps when counter 213 increments from the second preloaded value. Increases in $V_{MR}$ can halt when second comparator 214 output signal, Cmp_out, is asserted to inhibit counter 213. This can immediately freeze the count at a calibration value and $V_{MR}$ at the predetermined bias level. As shown in FIG. 5, the bias voltage calibrator can, for example, finish calibration to a given bias voltage of approximately 200 mV in approximately 1.0 μs.

Figure 6:
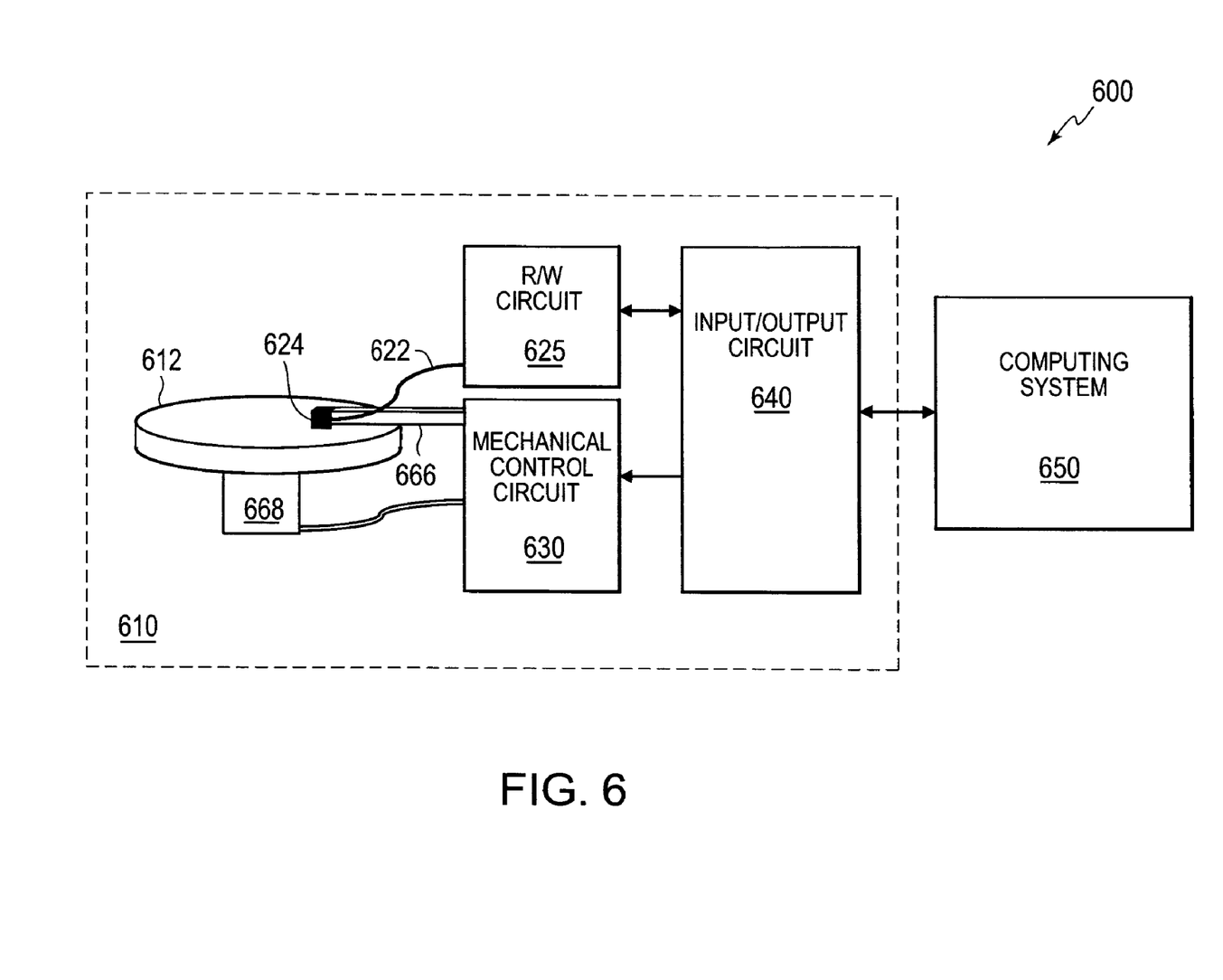
FIG. 6. is an exemplary diagram of the bias setting memory device.

FIG. 6 is a block diagram of an exemplary bias setting memory device 600. As shown in FIG. 6, memory device 600 can include a computing system 650 with a data storage system 610. The data storage system 610 can include a disk-shaped memory medium 612 spun by a motor 668 that may be read from using transducer 624 held by armature 666. The data storage system 610 can further include a read/write circuit 625 coupled to transducer 624 via signal path 622, a mechanical control circuit 630 coupled to both motor 668 and armature 666, and an input/output circuit 640.

In operation, computing system 650 may store or retrieve data in data storage system 610 using any number of known or later developed commands and/or interface standards. For example, computing system 650 may retrieve data stored on memory medium 612 by issuing a command to input/output circuit 640 via a universal serial bus (USB) cable. In response, input/output circuit 640 may cause mechanical control circuit 630 to move transducer 624 to a specific location on memory medium 612, and further cause read/write circuit 625 to extract and forward data sensed by transducer 624, which then may be passed to computing system 650.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A biasing device comprising:
   a bias-able element that can be biased to a reference condition prior to operation of the bias-able element; and
   a controller that is coupled to the bias-able element, and that is configured to adjust an initial biasing voltage by a first amount when an intermediate voltage threshold exceeds a voltage drop across the bias-able element and to change the adjusted initial biasing voltage by a second amount until the voltage drop across the bias-able element substantially equals a predetermined bias voltage, wherein the second amount is less than the first amount.

2. The biasing device according to claim 1, the controller including a bias circuit, and the bias-able element coupled to the bias circuit that is configured to provide the bias-able element with the biasing voltage.

3. The biasing device according to claim 2, the controller further including a state adjuster, and the bias circuit coupled to the state adjuster that is configured to control a state of the bias circuit, and thereby change the biasing voltage.

4. The biasing device according to claim 3, the controller further including a response classifier coupled to the bias-able element, the response classifier being configured to receive an input signal from the bias-able element and compare the input signal with at least one threshold value.

5. The biasing device according to claim 4, wherein the response classifier is coupled to the state adjuster, the response classifier being configured to generate at least an output signal to the state adjuster.

6. The biasing device according to claim 5, wherein the state adjuster is configured to receive a setpoint and generate at least a state adjust signal based on the setpoint and the at least an output signal, the state adjust signal controlling the bias circuit.

7. The biasing device according to claim 6, the response classifier including first and second comparators, the first comparator being configured to compare the input signal with a first threshold value, and the second comparator being configured to compare the input signal with a second threshold value.

8. The biasing device according to claim 7, wherein the first threshold value is configured to be less than the second threshold value.

9. The biasing device according to claim 7, wherein the first threshold value is set dynamically to a first value at a start time of calibration of the bias-able element and set to a second value at an intermediate time during the calibration, the second value being higher than the first value.

10. The biasing device according to claim 7, the state adjuster including a decoder and a counter, the first comparator being coupled to the decoder that is configured to receive a first output signal from the first comparator, and the second comparator being coupled to the counter that is configured to receive a second output signal from the second comparator.

11. The biasing device according to claim 10, the decoder including a finite state machine configured to receive the setpoint and the first output signal and generate a starting value for successive approximations of a bias level of the biasing device.

12. The biasing device according to claim 11, wherein the counter is configured to receive the starting value from the decoder and generate an output control word to the bias circuit, the output control word controlling the bias circuit and thereby changing a state of the bias-able element.

13. The biasing device according to claim 4, wherein the response classifier is one of a uniform quantizer, a non-uniform quantizer, a two-bit flash analog-to-digital converter, and a direct conversion analog-to-digital converter that quantizes a measurement of the bias-able element into a two-bit binary word.

14. The biasing device according to claim 1, wherein the bias-able element is one of a magnetoresistor, a spin value, a thermistor, a microphone, a photodetector, a light emitting diode, a laser diode, a superluminescent diode, an acoustic source, a heat source, electromagnetic field source, and a radio frequency source.

15. A memory device using the biasing device according to claim 1.

16. A method for biasing a bias-able device comprising:
   generating an initial biasing voltage;
   adjusting the initial biasing voltage by a first amount when an intermediate voltage threshold exceeds a voltage drop across the bias-able device; and
   changing the adjusted initial biasing voltage by a second amount until the voltage drop across the bias-able device substantially equals a predetermined bias voltage, wherein the second amount is less than the first amount.

17. The method for biasing a bias-able device according to claim 16, further comprising:

generating an input signal by the bias-able device to a controller; and setting first and second threshold values by the controller, the first threshold value being configured to be less than the second threshold value.

18. The method for biasing a bias-able device according to claim 17, further comprising:

comparing the input signal with the first threshold value; and comparing the input signal with the second threshold value.

19. The method for biasing a bias-able device according to claim 18, further comprising:

generating a first output signal to a state adjuster based on the comparing of the input signal with the first threshold; and generating a second output signal to the state adjuster based on the comparing of the input signal with the second threshold.

20. The method for biasing a bias-able device according to claim 19, further comprising:

generating a control signal by the state adjuster based on the first and second output signals; and changing a state of the bias-able device based on the control signal until the bias-able device is biased to a predetermined bias level of the predetermined bias voltage.

21. The method for biasing a bias-able device according to claim 17, further comprising:

setting the first threshold value dynamically to a first value at a first time during a calibration of the bias-able device; and setting the first threshold value dynamically to a second value at a second time during the calibration, wherein the second value is higher than the first value.

* * * * *